United States Patent
Cloud et al.

[19]

[11] Patent Number: 6,111,184
[45] Date of Patent: Aug. 29, 2000

[54] INTERCHANGEABLE PICKUP, ELECTRIC STRINGED INSTRUMENT AND SYSTEM FOR AN ELECTRIC STRINGED MUSICAL INSTRUMENT

[75] Inventors: Roger A. Cloud, Scotts Valley; Pavl C. Zachary, Aptos, both of Calif.

[73] Assignee: E-mu Systems, Inc., Scotts Valley, Calif.

[21] Appl. No.: 09/237,336

[22] Filed: Jan. 26, 1999

Related U.S. Application Data

[60] Provisional application No. 60/073,094, Jan. 30, 1998.

[51] Int. Cl.[7] ................................ G10H 3/00; G10H 3/14
[52] U.S. Cl. ................................ 84/723; 84/725; 84/730; 84/DIG. 24
[58] Field of Search ..................... 84/723–728, 730–731, 84/743, DIG. 24

[56] References Cited

U.S. PATENT DOCUMENTS

| | | | |
|---|---|---|---|
| 3,619,468 | 11/1971 | Evans | 84/1.16 |
| 3,813,473 | 5/1974 | Terymenko | 84/1.16 |
| 3,869,952 | 3/1975 | Rowe | 84/1.16 |
| 3,992,972 | 11/1976 | Rickard | 84/1.16 |
| 4,334,452 | 6/1982 | Morrison, III et al. | 84/1.16 |
| 4,425,831 | 1/1984 | Lipman | 84/1.16 |
| 4,433,603 | 2/1984 | Siminoff | 84/1.16 |
| 4,506,579 | 3/1985 | Rossum | 84/1.01 |
| 4,683,589 | 7/1987 | Scholz et al. | 381/61 |
| 4,699,038 | 10/1987 | Wedge | 84/1.1 |
| 4,702,141 | 10/1987 | Bonanno | 84/1.16 |
| 4,711,149 | 12/1987 | Starr | 84/1.16 |
| 4,817,486 | 4/1989 | Saunders | 84/1.15 |
| 4,827,824 | 5/1989 | Minakuchi | 84/1.16 |
| 4,854,210 | 8/1989 | Palazzolo | 84/1.15 |
| 4,872,386 | 10/1989 | Betticare | 84/726 |
| 4,916,409 | 4/1990 | Tracy | 330/294 |
| 4,987,600 | 1/1991 | Rossum | 381/118 |
| 5,012,716 | 5/1991 | Pagelli | 84/727 |
| 5,014,588 | 5/1991 | Omata et al. | 84/726 |
| 5,025,704 | 6/1991 | Davis | 84/723 |
| 5,029,511 | 7/1991 | Rosendahl | 84/743 |
| 5,072,645 | 12/1991 | Rossum | 84/660 |
| 5,085,119 | 2/1992 | Cole | 84/724 |
| 5,111,727 | 5/1992 | Rossum | 84/603 |
| 5,136,919 | 8/1992 | Wolstein | 84/742 |
| 5,144,676 | 9/1992 | Rossum | 381/118 |
| 5,170,369 | 12/1992 | Rossum | 364/724.17 |
| 5,248,845 | 9/1993 | Massie et al. | 84/622 |
| 5,252,777 | 10/1993 | Allen | 84/726 |
| 5,270,475 | 12/1993 | Weiss et al. | 84/603 |
| 5,298,671 | 3/1994 | Bliss | 84/603 |
| 5,303,309 | 4/1994 | Rossum | 381/118 |
| 5,308,916 | 5/1994 | Murata et al. | 84/603 |
| 5,311,806 | 5/1994 | Riboloff | 84/728 |

(List continued on next page.)

OTHER PUBLICATIONS

Advertisement—Samick Guitar, Samick Music Corporation.
Advertisement—StarrSwitch 4+, Spectrum–1, 2–stage Midrange EQ, Spectrum–7 7–band EQ, and Super Squeezer, StarrSwitch Company.
Advertisement—Pow'r Bridge 'ST' and Poly–Drive 1, RMC Pickup Co.
Advertisement—The Buzz Feiten Tuning System—Washburn Dealer/Buzz Feiten Design Company, LLC.

*Primary Examiner*—Stanley J. Witkowski
*Assistant Examiner*—Marlon T. Fletcher
*Attorney, Agent, or Firm*—Cooley Godward LLP

[57] ABSTRACT

A generally rectangular shaped universal pickup cradle (50, 154 or 156) for an electric musical stringed instrument (20 or 150) allows a plurality of different pickups (50, 154, 156) to be interchangeably inserted into the stringed musical instrument. In addition, there are one or more receptacle cavities (36, 38, 40, 152) in the stringed musical instrument (20, 150) so that any of the universal pickup cradles (50, 154, 156) may be placed within any of the receptacle cavities. The universal pickup cradles (50, 154, 156), in combination with a separate electronics module (177, 200), provide a flexible and upgradeable system for an electric stringed instrument.

13 Claims, 14 Drawing Sheets

U.S. PATENT DOCUMENTS

| | | | |
|---|---|---|---|
| 5,317,104 | 5/1994 | Frost | 84/625 |
| 5,342,990 | 8/1994 | Rossum | 84/603 |
| 5,430,244 | 7/1995 | Ruffcorn et al. | 84/669 |
| 5,524,074 | 6/1996 | Massie | 381/62 |
| 5,537,477 | 7/1996 | Gauthier et al. | 381/68.2 |
| 5,557,057 | 9/1996 | Starr | 84/617 |
| 5,637,823 | 6/1997 | Dodge | 84/743 |
| 5,698,803 | 12/1997 | Rossum | 84/607 |
| 5,817,966 | 10/1998 | Fishman | 84/731 |
| 5,834,671 | 11/1998 | Phoenix | 84/645 |
| 5,837,912 | 11/1998 | Eagen | 84/267 |
| 5,900,572 | 5/1999 | Aaro | 84/731 |

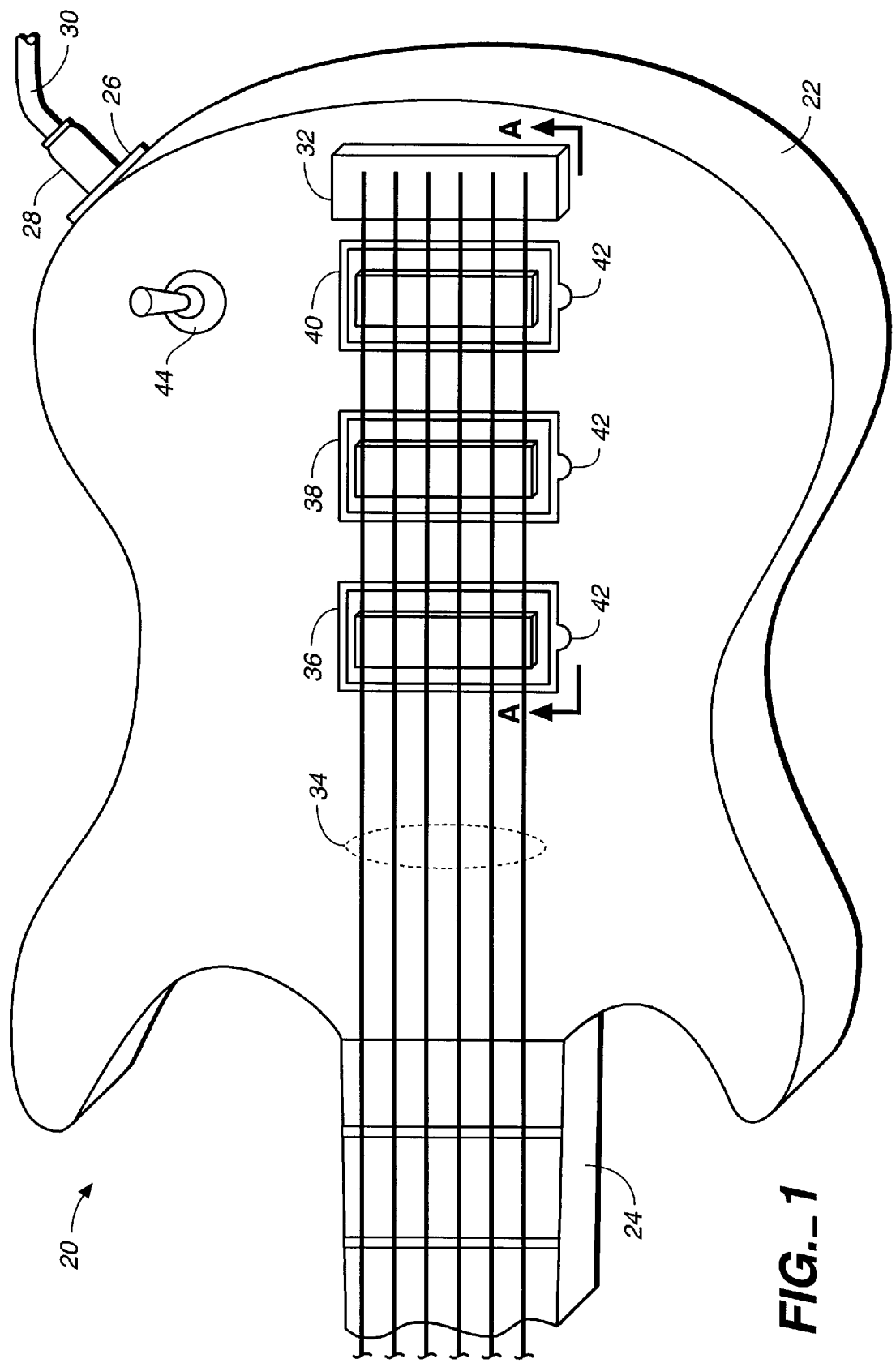
FIG._1

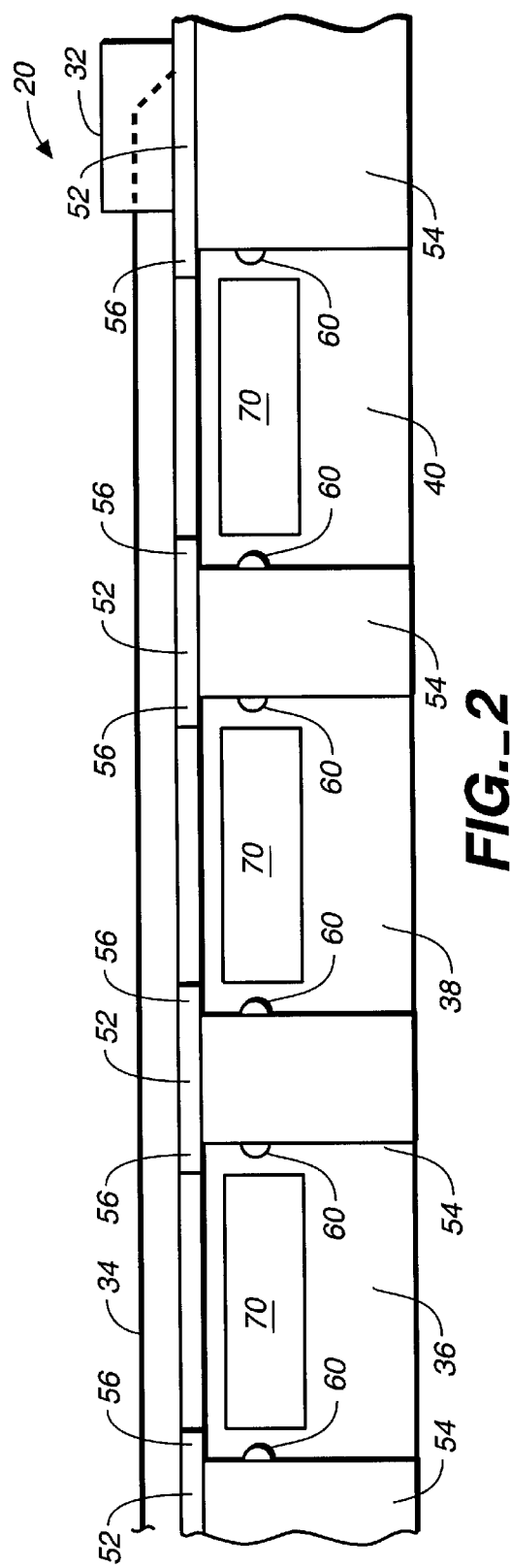
FIG._2
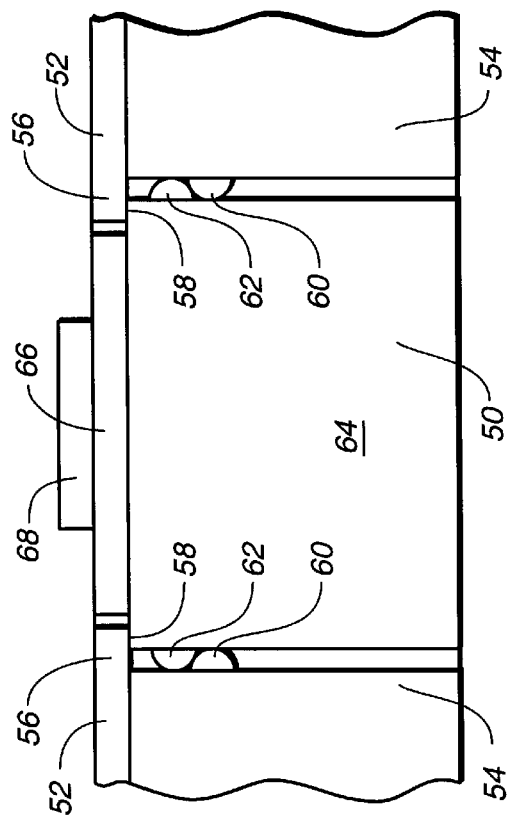
FIG._3

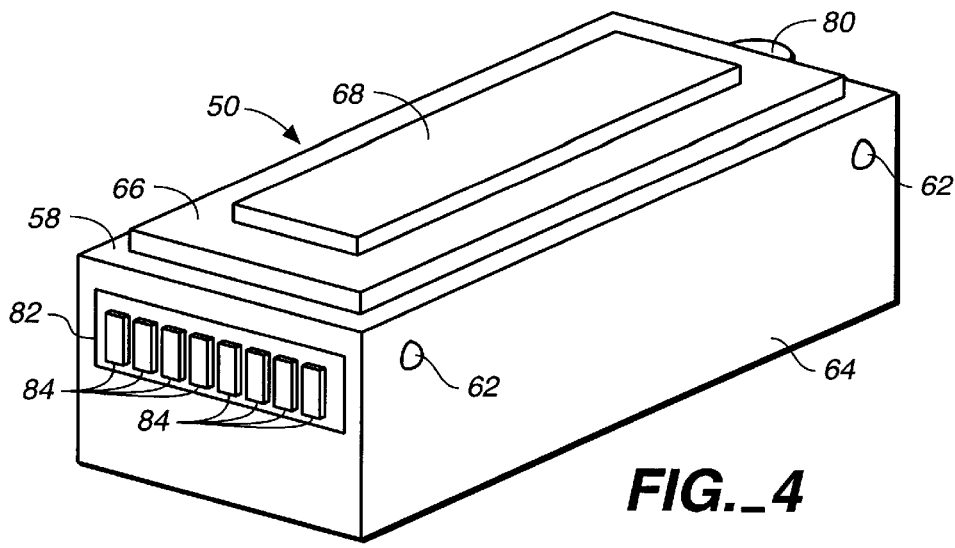
FIG._4
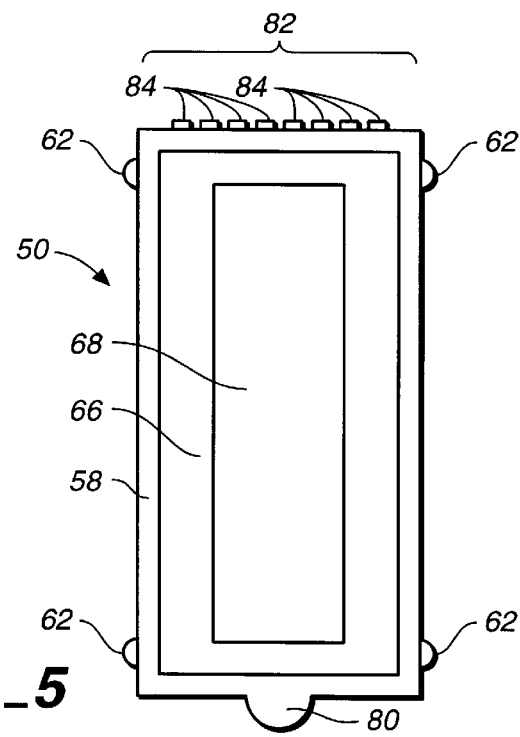
FIG._5
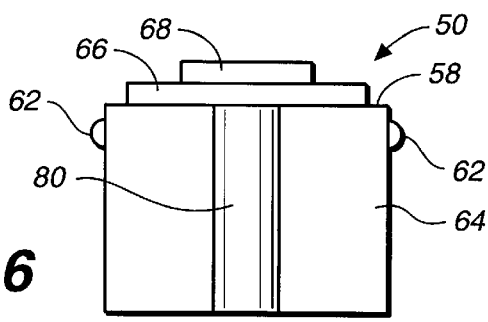
FIG._6

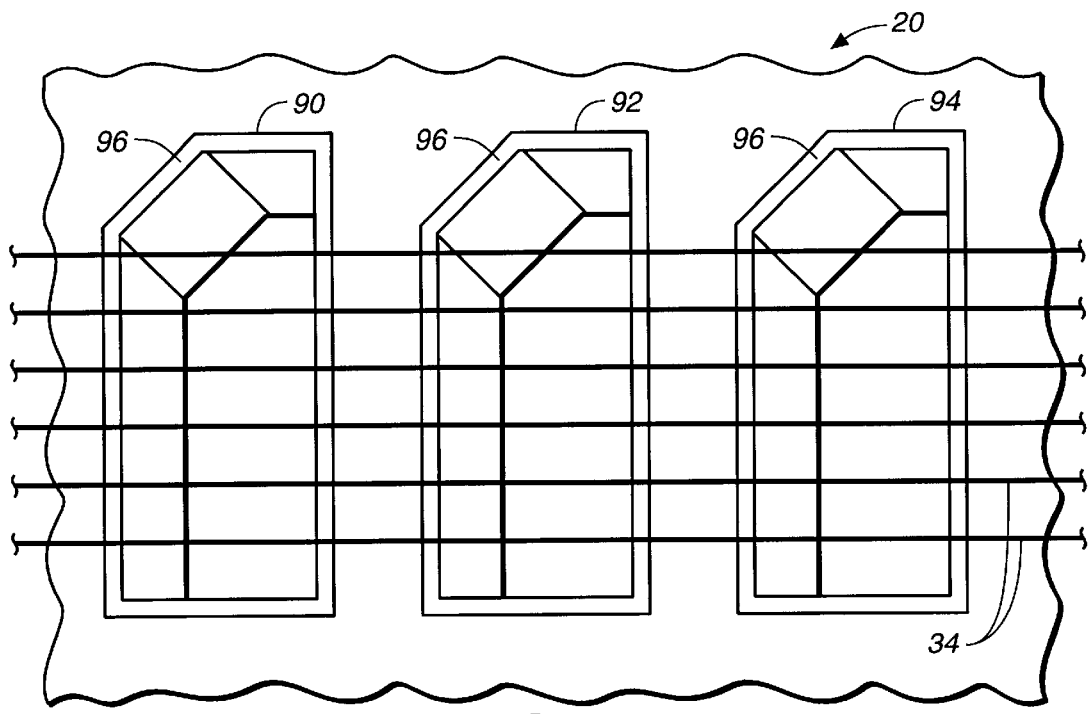
FIG._7
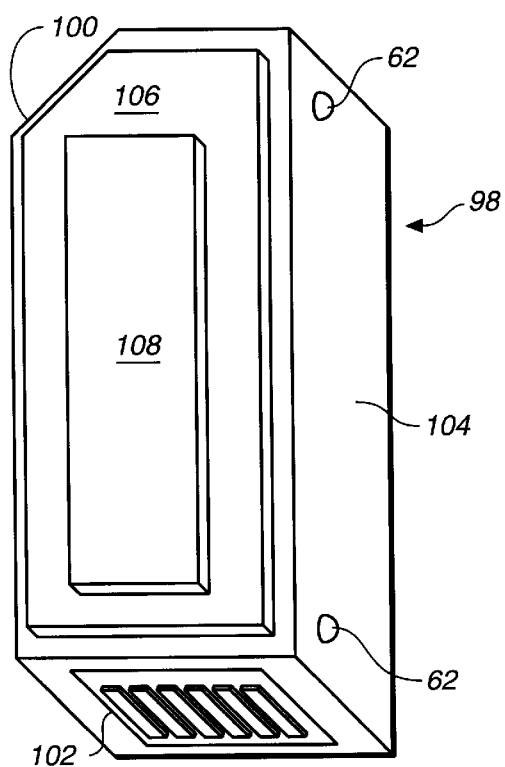
FIG._8
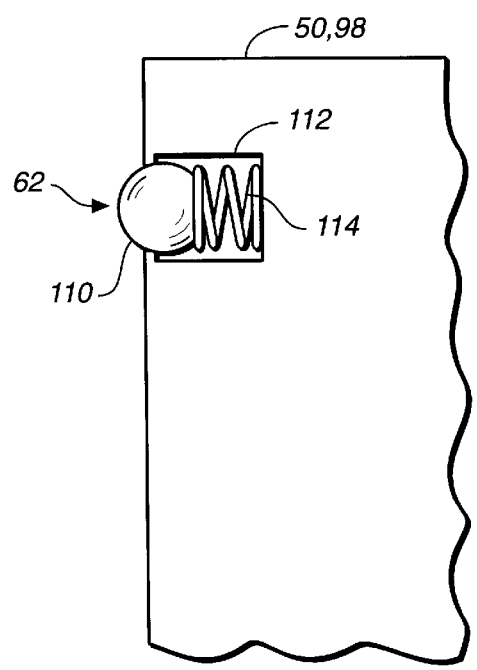
FIG._9

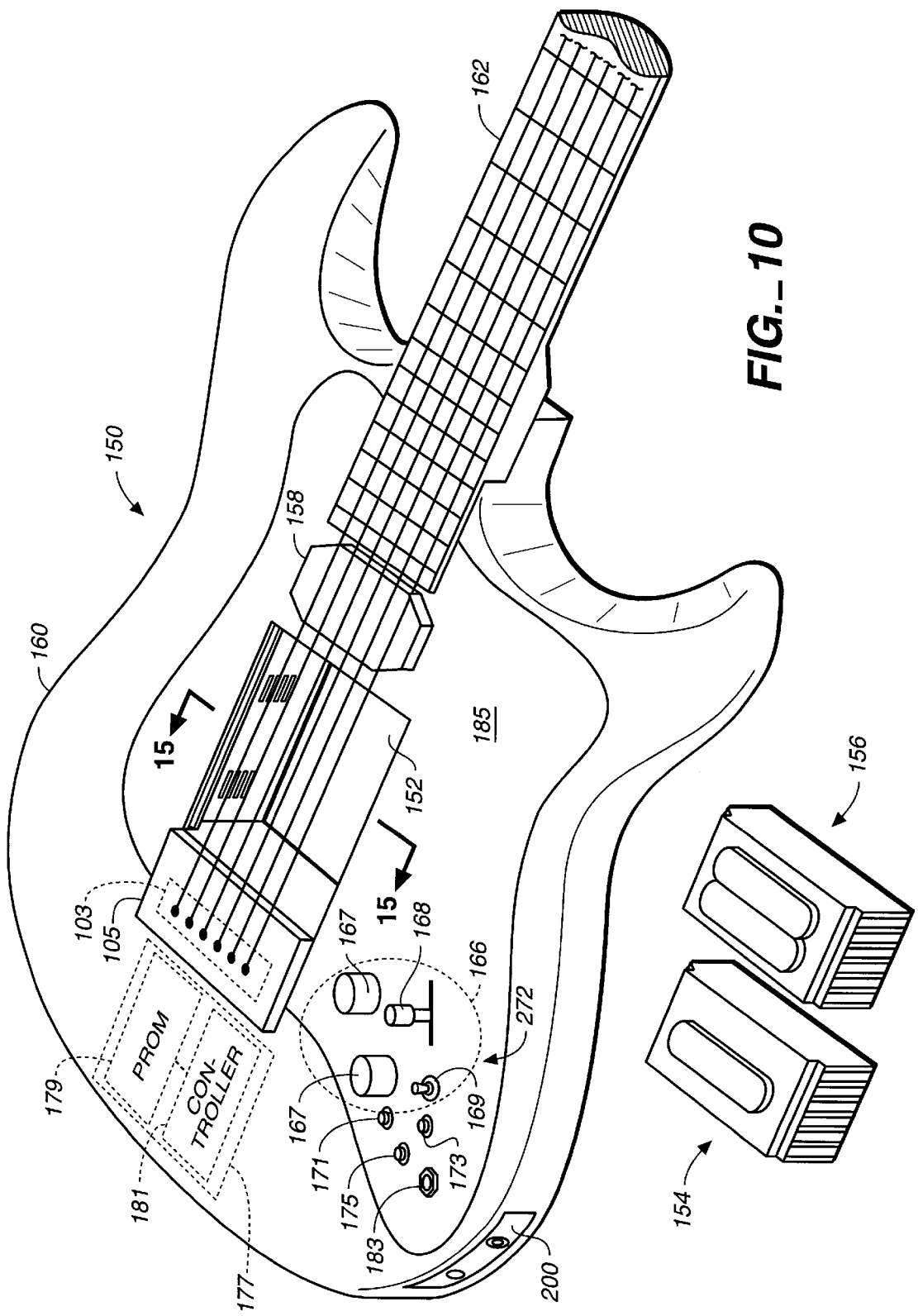
FIG._10

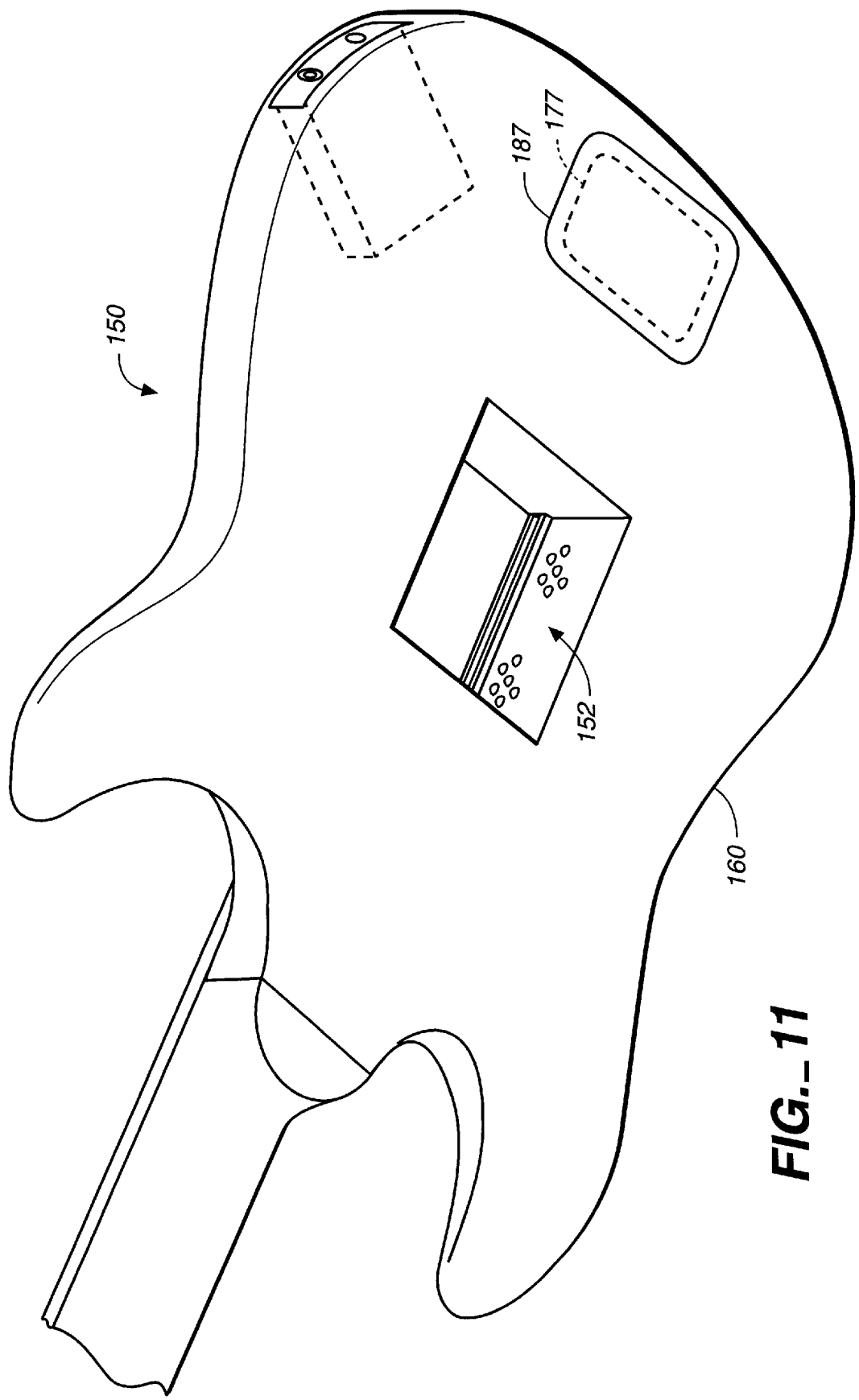
FIG._11

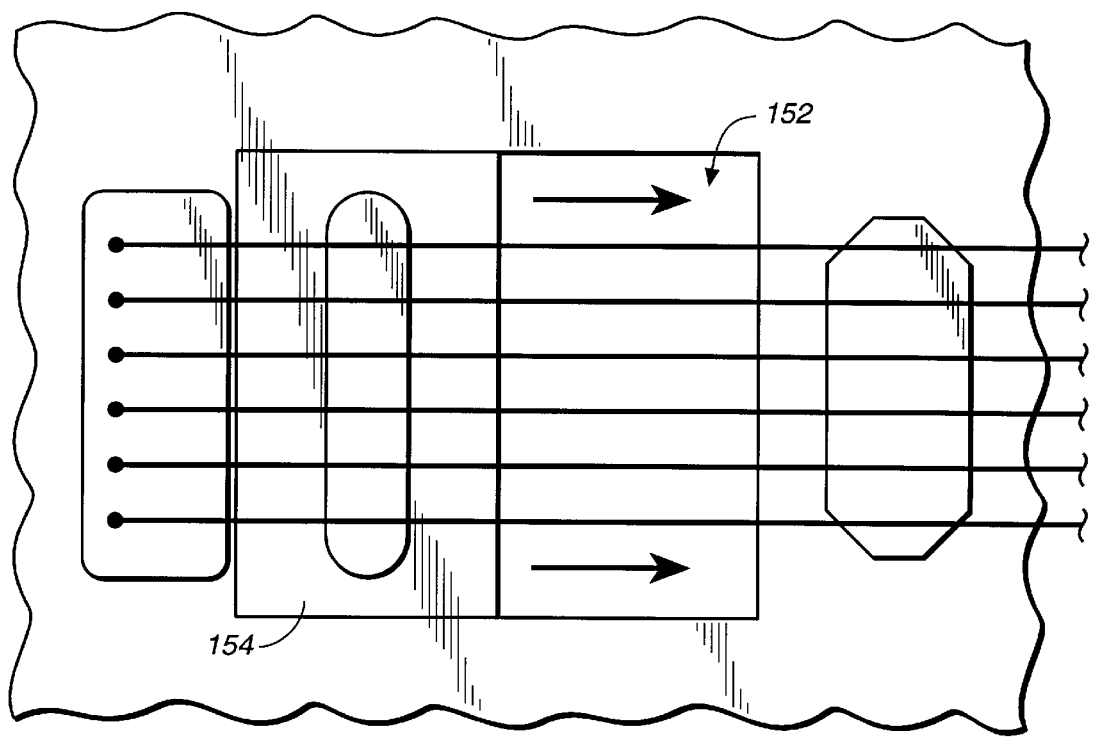
*FIG._12A*
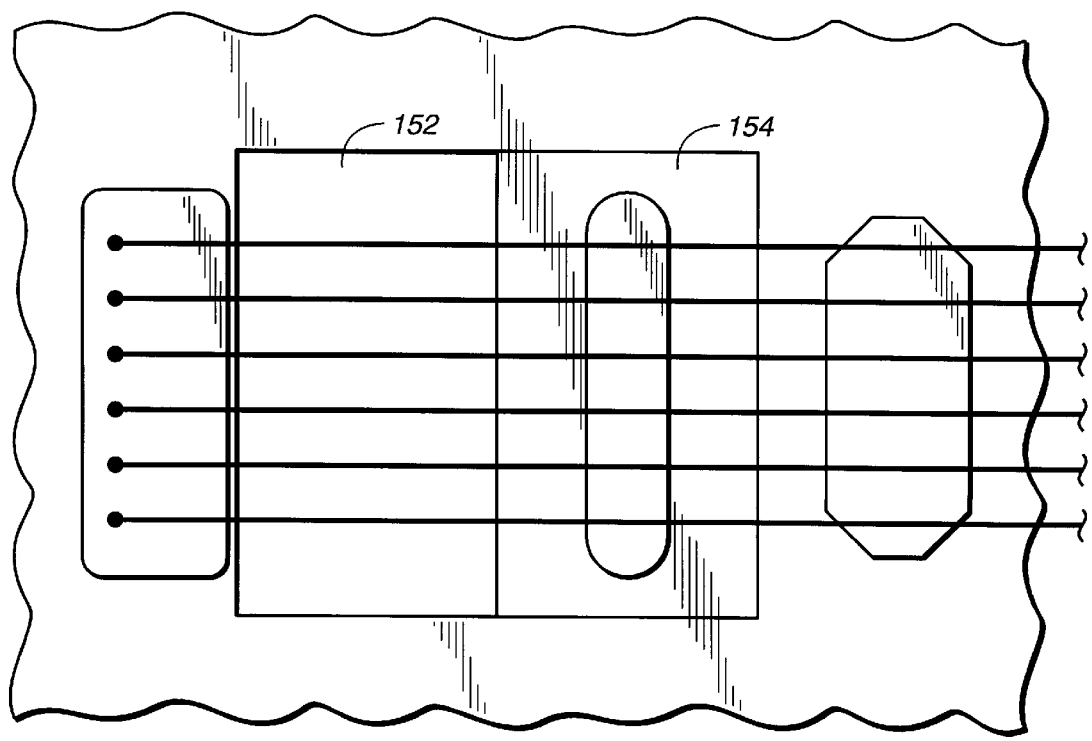
*FIG._12B*

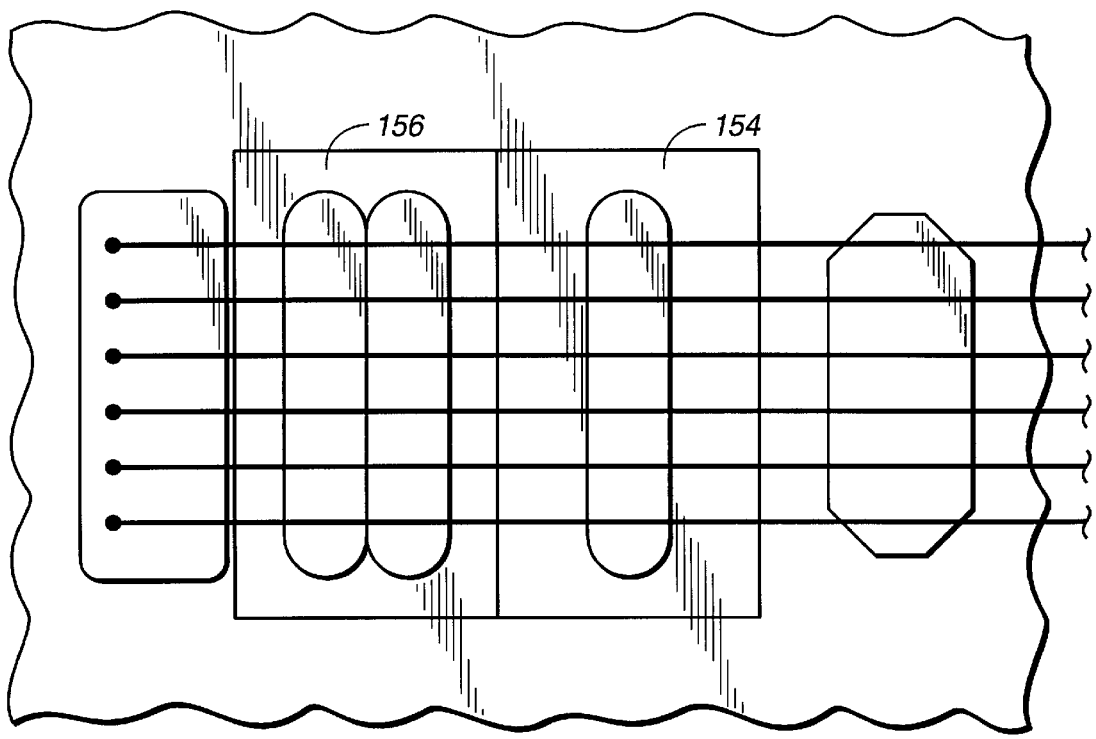
FIG._13
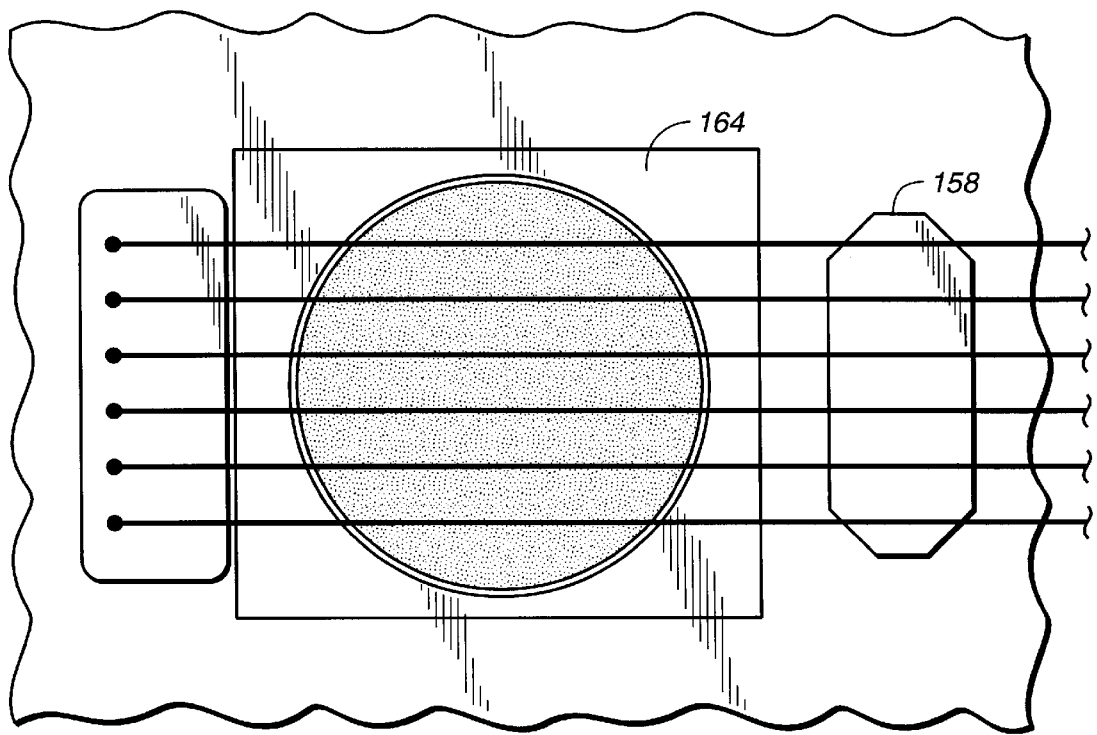
FIG._14

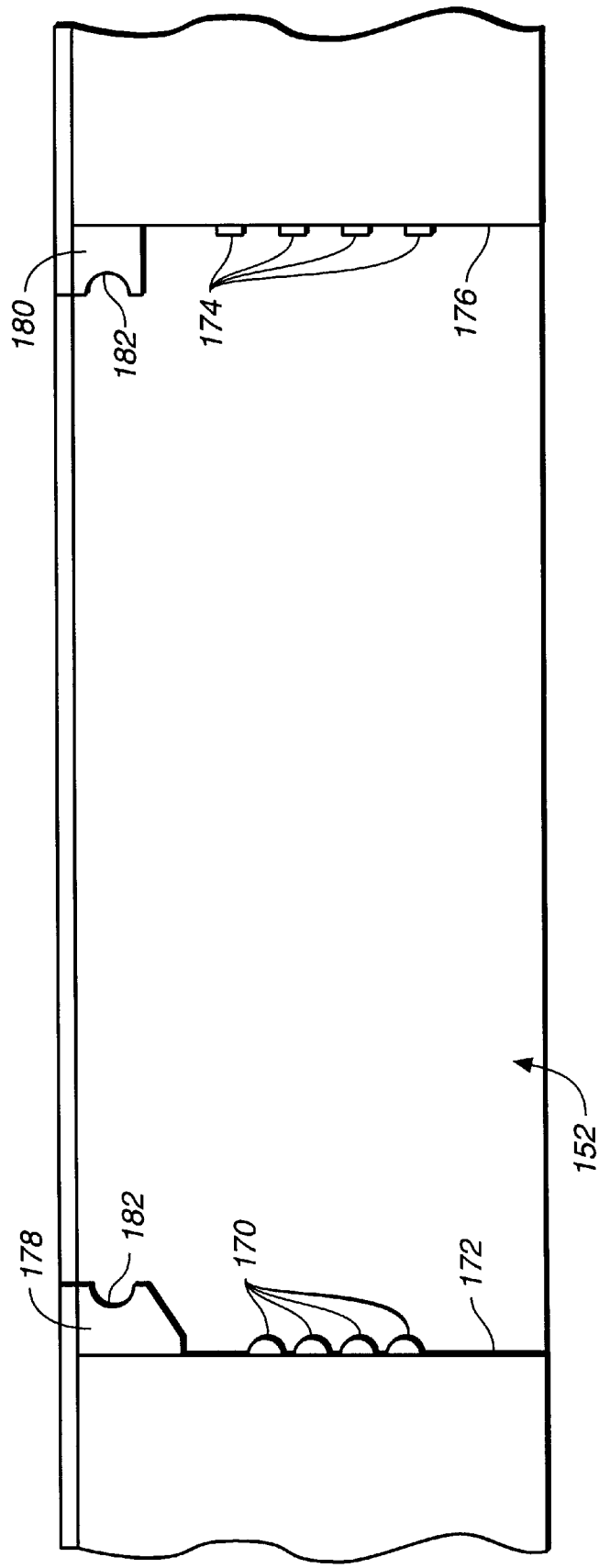

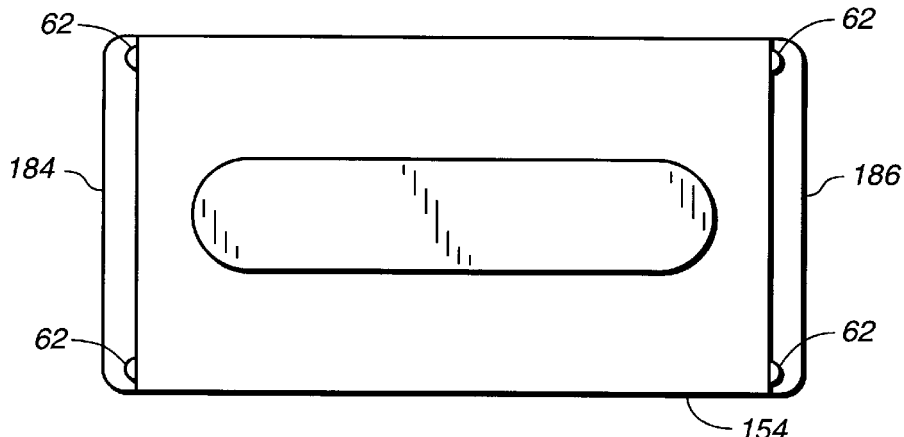
FIG._16
FIG._17
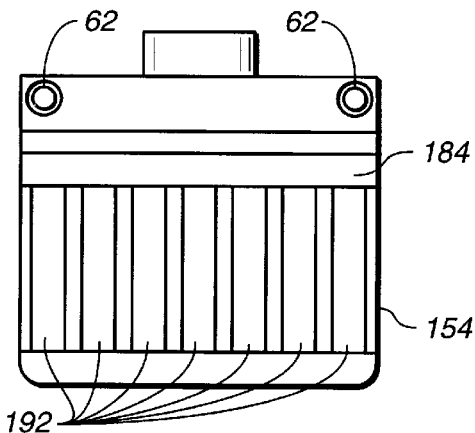
FIG._18
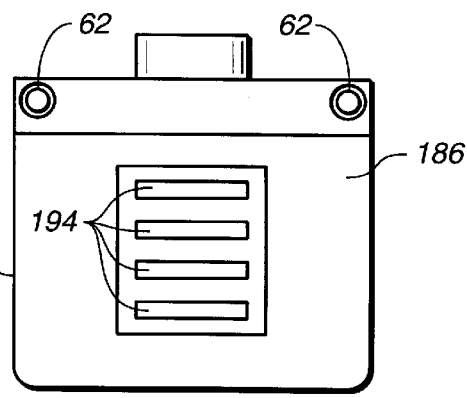
FIG._19

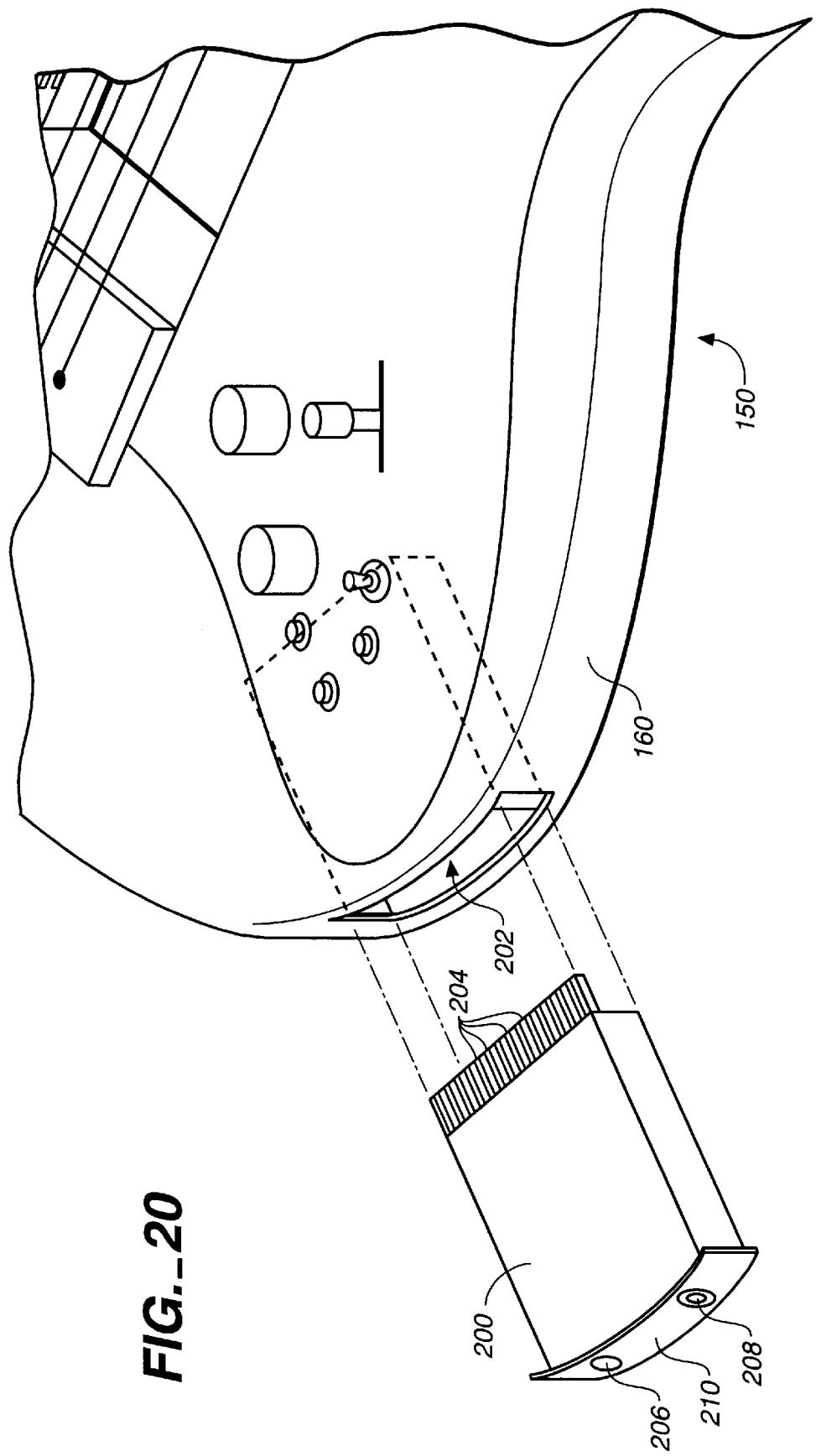
FIG._20

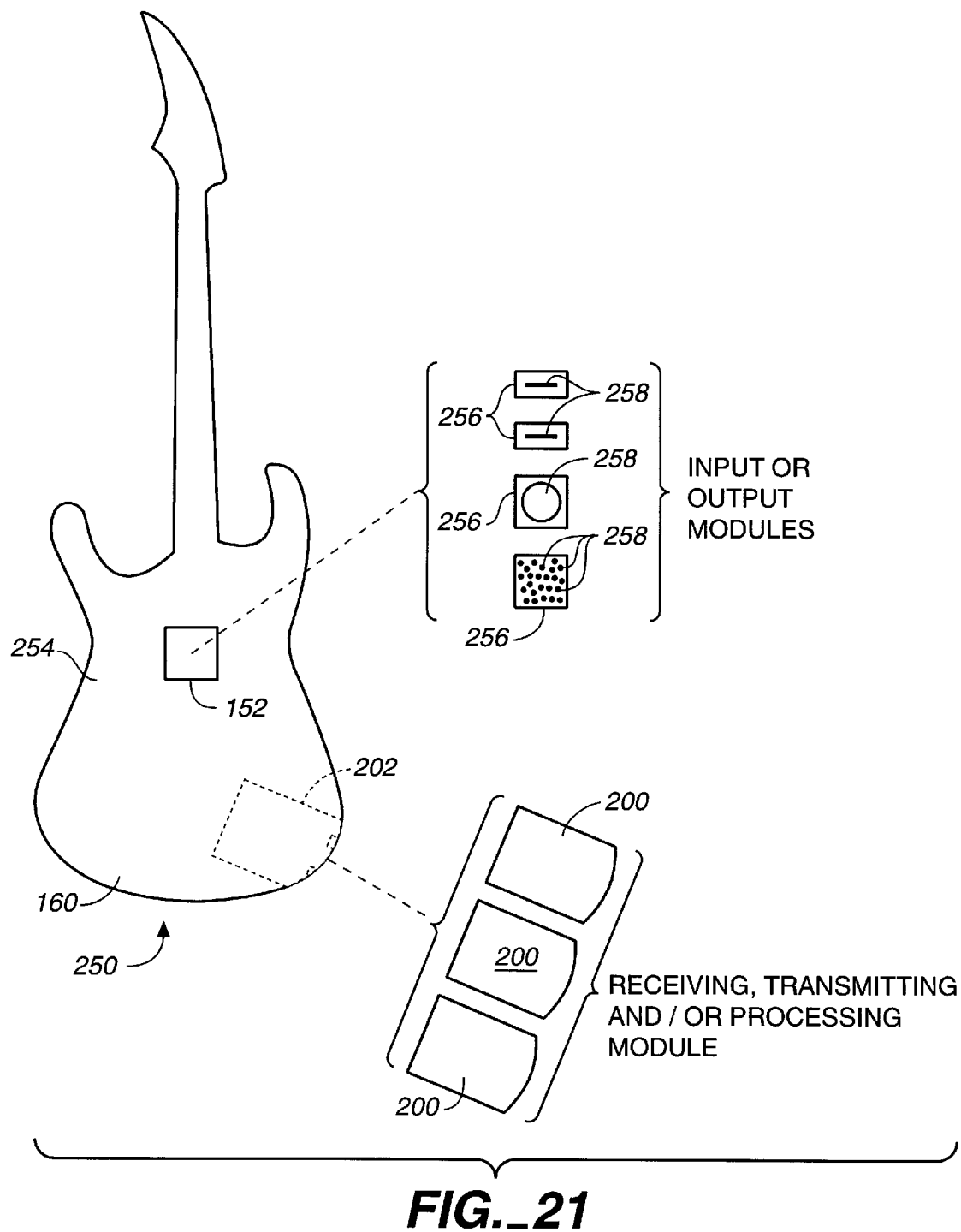
FIG._21

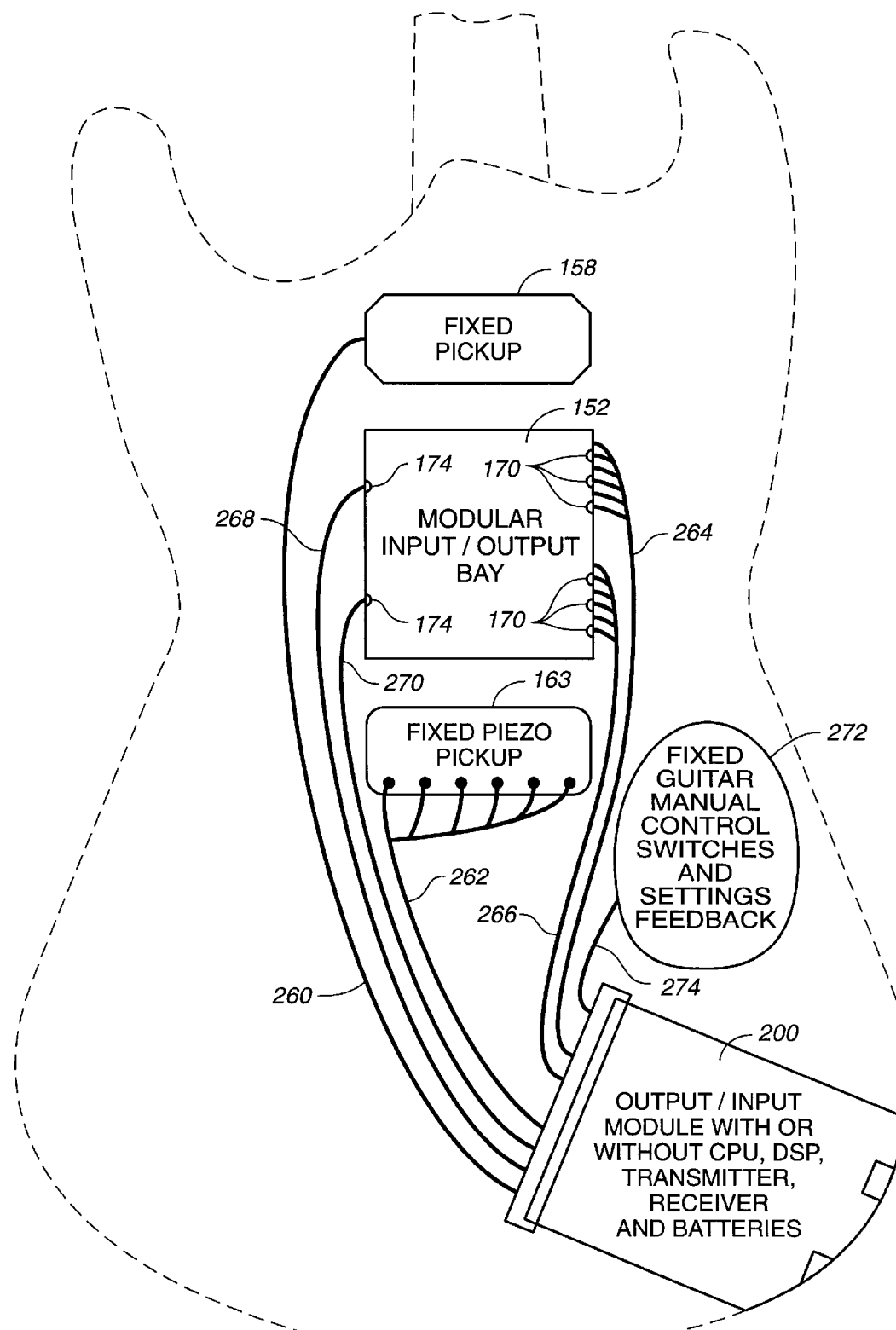
FIG._22

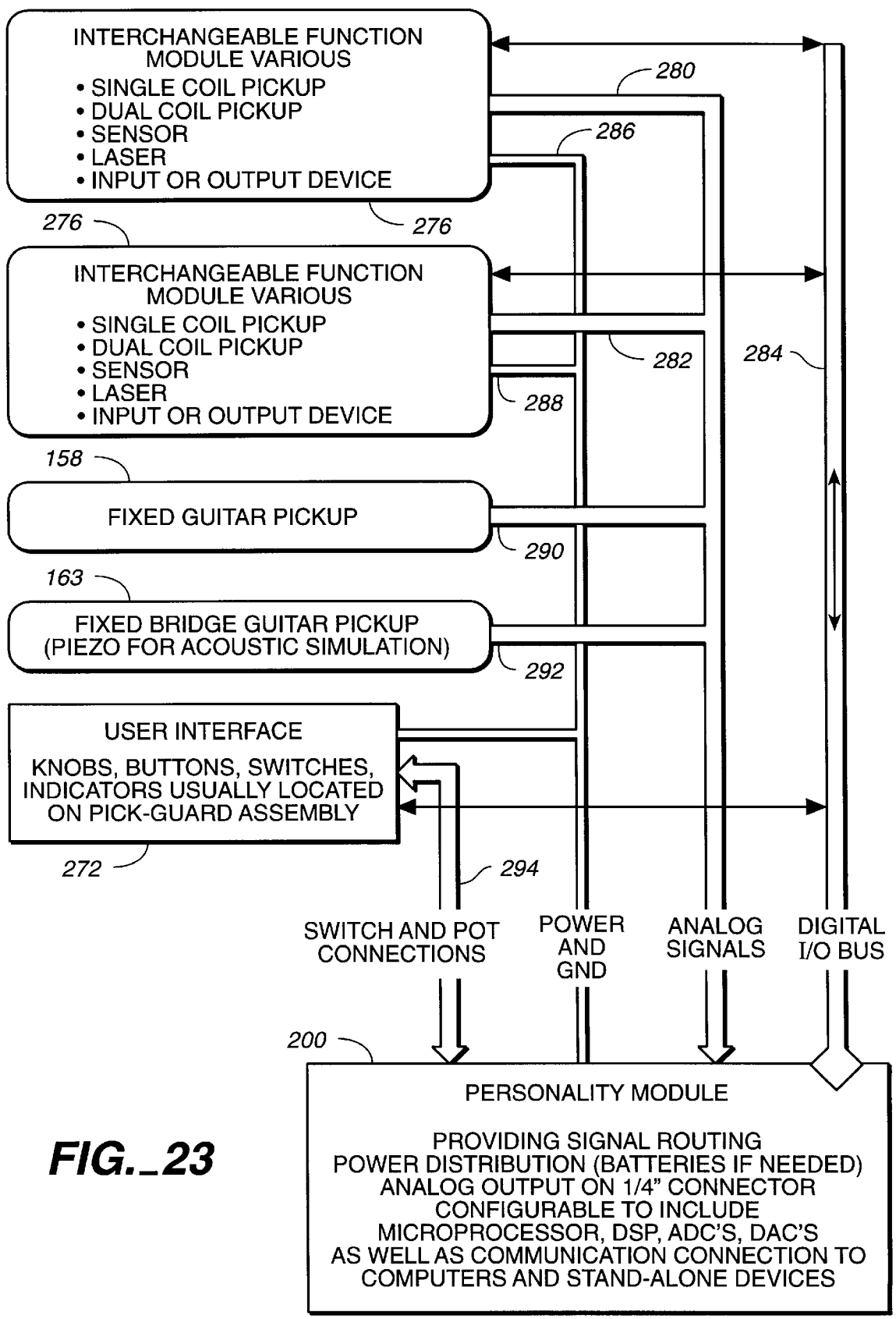

INTERCHANGEABLE PICKUP, ELECTRIC STRINGED INSTRUMENT AND SYSTEM FOR AN ELECTRIC STRINGED MUSICAL INSTRUMENT

This application claims benefit of Provisional Application Ser. No. 60/073,094 filed Jan. 30, 1998.

INTRODUCTION

1. Background of the Invention

This invention relates generally to a device for detecting and amplifying sound vibrations, and in particular to a device that detects and amplifies the sounds of a stringed musical instrument, such an electric guitar.

Various stringed musical instruments produce sound due to the vibration of one or more strings on the stringed musical instrument. Some of these stringed musical instruments are acoustical (i.e., an acoustical sound is generated) while other are electric (i.e., the vibration of the string is converted into an electrical signal which in turn is converted into a sound. For example, an electric guitar is "electric" by reason of it having electromagnetic "pickups" beneath the metal strings of the guitar. These pickups consist of very thin wire, such as copper wire, wound around magnets. Due to conventional, well known electrical phenomena, the movement of a metal string in proximity to the pickup causes the pickup to generate a minute electrical signal which corresponds to the vibration of the related string, thus exhibiting the string's characteristics, such as pitch and the presentation of frequencies including harmonics.

Typically, electric guitars feature two or more pickups in order to allow a musician to select which "pickup" or pickups will, at any given time, be effectively generating the signal corresponding to the vibrations of the strings. The position at which a pickup is mounted and the length of the guitar's strings are factors in the tone generated when the particular string vibrates. All other factors being equal, the tone of the sound generated by a guitar string will be most brilliant (i.e., consisting of higher order harmonics and thus "brighter") nearer the bridge of the guitar, and will present more lower order harmonics from a pickup mounted nearer the joint of the neck and body of the guitar. Theoretically, of course, pickups can be mounted anywhere along the string's vibrating length, and even within the guitar's "neck." However, conventionally, pickups are mounted within the guitar's body, at 2–4 locations beneath the strings in an area from the neck/body joint to the bridge of the guitar. A switch is conventionally employed by the user to determine which one or more pickup's or pickups' signals are to be presented (including combinations of pickups).

For a typical guitar, including an electric guitar, there are typically six strings which are strung across a distance of approximately 25.5 inches, so that the relevant vibrating portion of the string is between a "bridge" at the bottom of the guitar and a "nut" at the top of the neck of the guitar. Thus, from the nut mounting, the strings are tautly suspended over the guitar's "neck," and then, after the neck joins with the guitar's body, continue over the body until they terminate at the bridge. The strings are typically also selectively "fretted" at various locations (i.e., depressed by the player's fingers such that the fretted string's effective vibrating length is altered, and, accordingly, the pitch of the pertinent string when strummed).

A major determining factor in the tone of an electric guitar, and perhaps even the single most important element, is the nature of pickup employed and the location of the pickup. Many different configurations of pickups, and combinations of pickups, have been employed by various guitar manufacturers. In fact, a huge aftermarket has developed for the sale of replacement retrofittable pickups which have been designed to have different features from the pickups they are intended to replace (e.g., higher output; wiring to produce different timbral results; etc.), while retaining precisely the same physical dimensions and characteristics in order to facilitate their retrofitting into the very cavities in which the pickups they are intended to replace have formerly been seated.

Due to the popularity and desirability of certain electric guitars, there are certain electric pickups whose configurations are dominant in the market. By far, the three most popular pickup configurations in terms of physical size, shape, and core elements, are known as the Stratocaster, Telecaster, and Humbucking pickup configurations. However, many other pickup designs exist and are of relative market importance and proliferation.

Some conventional systems permit interchangeable pickups for a guitar. These conventional systems offer pickups whose interchangeability is solely within their own particular systems. Thus, a user is forced to acquire only the pickups which fit to the particular system, which predictably, are pickups manufactured by the supplier of the related guitar. These interchangeable pickup systems do not permit the user to interchange any type of pickup. In addition, these systems also do not permit the pickups to be easily interchanged or for the position of the pickups to be changed easily. Thus, the invention is directed to an interchangeable pickup system and method which avoid these and other problems with the conventional systems.

SUMMARY OF THE INVENTION

The universal pickup system provides one or more receptacle cavities in the body of a stringed instrument and a universal pickup cradle which may be positioned in any one of the receptacle cavities. Thus, a user of the stringed instrument may easily interchange his pickup with another pickup or change the location of the pickup by sliding the universal pickup cradle out of the receptacle cavity or by sliding a pickup to a different position in a single cavity dimensioned to receive more than one pickup cradle. The receptacle cavity and the universal pickup cradle each have one or more electrical connectors which mate with each other to provide an electrical connection between the pickup mounted on the universal pickup cradle and the stringed instrument. The one or more electrical connectors permit a signal for each string of the stringed musical instrument to be detected.

BRIEF DESCRIPTION OF THE DRAWINGS

FIG. 1 is a perspective view illustrating a portion of a stringed musical instrument, such as an electric guitar, incorporating a universal pickup system in accordance with a first embodiment of the invention;

FIG. 2 is a cross section view of the electric guitar shown in FIG. 1;

FIG. 3 is a blown-up cross section view of a universal pickup cradle seated within a receptacle cavity;

FIG. 4 is a perspective view of a universal pickup cradle in accordance with the invention;

FIG. 5 is a top view of the universal pickup cradle of FIG. 4;

FIG. 6 is an end view of the universal pickup cradle of FIG. 4;

FIG. 7 is a perspective view illustrating a second embodiment of receptacle cavities in accordance with the invention;

FIG. 8 is a perspective view illustrating a second embodiment of a universal pickup cradle in accordance with the invention;

FIG. 9 is a cross section view illustrating the details of a ball catch mechanism;

FIG. 10 is a perspective view from a top orientation, illustrating an electric guitar incorporating a universal pickup system in accordance with a third embodiment of the invention;

FIG. 11 is a perspective view from a bottom orientation, further illustrating the electric guitar of FIG. 10;

FIGS. 12A, 12B, 13 and 14 are top views of a portion of the electric guitar shown in FIGS. 10–11;

FIG. 15 is a cross section view taken along the line 15—15 in FIG. 10.

FIGS. 16, 17, 18 and 19 are, respectively, top, side, left end and right end views of one of the universal pickup cradles shown in FIG. 10, for use with the electric guitar shown in FIGS. 10–15, showing further details of the invention;

FIG. 20 is a perspective view of a portion of the electric guitar shown in FIGS. 10–15;

FIGS. 21–23 are schematic diagrams showing circuit and system elements in an electric guitar system in accordance with the invention.

DESCRIPTION OF SPECIFIC EMBODIMENTS
Detailed Description of a Preferred Embodiment The invention is particularly applicable to a receptacle cavity and universal pickup cradle for an electric guitar. It is in this context that the invention will be described. It will be appreciated, however, that the system and method in accordance with the invention has greater utility, such as for other stringed musical instruments.

FIG. 1 is a diagram illustrating an electric guitar 20 having a body portion 22 and a neck portion 24. A receptacle 26 in the body 22 mates with a plug 28 which is connected to a cable 30. The cable and plug allow electrical signals generated by pickups described below from vibrations of the strings being played to be transmitted to an amplifier (not shown). The guitar also has a bridge 32 and a plurality of strings 34 which are attached to the bridge 32 at one end and the top of the neck of the guitar (not shown) at the other. As is well known, a person strums one or more strings of the guitar and a pickup detects that vibration of the string(s) and translates it into electrical signal(s). In accordance with the invention, there are one or more receptacle cavities within the body of the guitar which house a universal pickup cradle, as described below. In particular, there is a first receptacle cavity 36, a second receptacle cavity 38, and a third receptacle cavity 40. As shown, each of these receptacle cavities is underneath all of the strings of the guitar.

Each receptacle cavity has an indexing portion 42 so that a pickup cradle, as described below, is correctly positioned within the receptacle cavity in order to correctly position a pickup underneath the strings of the guitar. In particular, each pickup cradle can only be placed into these receptacle cavities in one direction, as described below. As can be seen from the drawings, each receptacle cavity has a similar shape such that a universal pickup cradle, as described below, may fit into either one of the receptacle cavities. Thus, it is easy for the user of the instrument to quickly change the location of the pickups which are attached to the universal pickup cradle, which in turn will change the sound generated by the strings. As described in more detail below, the pickup attached to the pickup cradle may be a plurality of different types of conventional pickups so that the invention is not limited to any particular type of pickup.

The receptacle cavities 36–40 in combination with the universal pickup cradles, as described below with reference to FIGS. 4–9, provide a technique for interchangeable pickups for a guitar. In addition, each receptacle cavity has an electrical connector 70 (FIG. 2) which connects to another electrical connector on the pickup cradle such that no rewiring is necessary in order to change pickups quickly. As described below in more detail, the pickup cradles may be inserted into the electrical guitar from the back of the guitar so that the strings of the guitar do not need to be unstring or retuned every time a pickup is changed. Thus, the universal pickup cradle in combination with one or more receptacle cavities provides a technique for very quickly switching pickups from one location to another location and/or for switching between different types of pickups. In addition, it is very easy to change pickups without having to restring the guitar.

In order to select between the various receptacle cavities and their respective pickups, a switch 44 permits the user of the guitar to select between a variety of different configurations. For convenience, the first receptacle cavity 36 is typical called a neck cavity, while the second receptacle 38 cavity is called the middle cavity and the third receptacle cavity 40 is known as the bridge cavity. Thus, using the switch 44, a user may select to use the pickup within the neck cavity only, the pickup within the neck cavity and the middle cavity in which the pickups are out of phase with each other, the pickup in the middle cavity only, the pickups in the middle and bridge cavities in which the pickups are out of phase with each other, and the pickup in the bridge cavity only. Obviously, in accordance with the invention, it is possible to have additional receptacle cavities within the guitar so that there may be additional configurations. Now, with reference to FIGS. 2 and 3, the receptacle cavities 36, 38, 40, and a universal pickup cradle which fits within these cavities will now be described.

FIG. 2 is a cross sectional view of the guitar 20 along the line AA as shown in FIG. 1. FIG. 3 is a close up view of one of the receptacle cavities having a universal pickup cradle 50 mounted within the cavity. The additional details of the universal pickup cradle 50 will be described below with reference to FIGS. 4 through 9. With reference to FIG. 2, the electric guitar 20 has a pick-guard surface 52 mounted on top of the a body 54 of the guitar 20. As shown, each receptacle cavity 36, 38, 40, has a lip portion 56 which is part of the pick-guard surface 52 and mates with a lip 58 of the universal pickup cradle 50 so that the universal pickup cradle fits snugly within the receptacle cavity. In order to hold the universal pickup cradle securely in the receptacle cavity, each receptacle cavity has a dimple 60 on each side of the receptacle cavity. As shown in FIG. 3, a ball catch 62 on either side of the universal pickup cradle 50 aligns with and seats into the dimples 60 of the receptacle cavity. The details of the ball catch 62 will be described below with reference to FIG. 9. Thus, once the universal pickup cradle 50 has been inserted into a receptacle cavity, the ball catch 62 holds the universal pickup cradle within the receptacle cavity.

Each universal pickup cradle 50 is identical to all of the other universal pickup cradles in outside dimensions such that any pickup cradle will fit into any one of the receptacle cavities. Each pickup cradle, however, may have a unique shape in its interior in order to accommodate a particular type of guitar pickup. Thus, a "Stratocaster" type pickup cradle has a universal outside dimension but is uniquely shaped in its interior to accommodate that type of pickup. Thus, in accordance to the invention, any type of pickup may be mounted into one of these universal pickup cradles 50 such that any type of pickup may be used within any of the receptacle cavities in accordance to the invention. In addition, two receptacle cavities may each have a different pickup so the user may switch between different pickups by moving the switch 44 shown in FIG. 1. Each pickup cradle 50 has a body portion 64, a second portion 66 mounted on top of the body portion 64, and a pickup 68 mounted on top of the second portion 66. As shown in FIG. 3, the second portion 66 is approximately the same height as the pickup guard 52 such that the pickup 68 is flush with the top of the guitar once the universal pickup cradle is inserted into the guitar.

Each receptacle cavity 36, 38, 40 also has a electrical strip connector 70 which mates with a electrical edge connector 82 (FIG. 4) on the universal pickup cradle 50, as described below with reference to FIGS. 4 and 5, in order to provide electrical connection between the guitar itself, the universal pickup cradle 50 and in particular the pickup 68. The invention is not limited to any particular type of electrical connection. Now, more details about the universal pickup cradle 50 will described with reference to FIGS. 4 through 9.

FIGS. 4, 5, and 6 are diagrams illustrating a perspective view, a top view, and an end view, respectively, of a first embodiment of the universal pickup cradle 50. A second embodiment of the universal pickup cradle will be described with reference to FIGS. 7 and 8. As shown in FIGS. 4, 5, and 6, the universal pickup cradle 50 has a ball catch 62 at each corner of the universal pickup cradle. In addition to the cradle body 60, the second portion 66 and the pickup 68, the universal pickup cradle 50 also includes an indexing portion 80 which insures that the universal pickup cradle 50 is properly inserted into one of the receptacles 36, 38, 40, as shown in FIG. 1. Referring briefly back to FIG. 1, as shown, each of the receptacle cavities has an indexing portion 42 which is identical to the indexing portion 80, so that the universal pickup cradle 50 may only be inserted into the receptacle in one direction. This is important because the end of the universal pickup cradle opposite from the indexing portion 80 contains an edge connector 82 which makes electrical contact with the strip connector 70 within the receptacle cavities, as shown in FIG. 2, to provide power to the pickup 68. Thus, it is necessary to insure that the edge connector 82 mates properly with the strip connector 70. The invention, however is not limited to any particular indexing portion and another embodiment of an indexing portion is shown below in FIGS. 7–8.

The edge connector 82 in combination with the strip connector 70 on the cavity will automatically effect the wiring (i.e., effectively electrically connect) the pickup 68 within the corresponding universal pickup cradle 50 to a set of universally sized contacts in corresponding strip connector 70. The strip connector is wired to a corresponding switching/wiring system in the guitar, which is not shown. Thus, once a universal pickup cradle 50 with a pickup 68 has been inserted into the receptacle cavity and clicked into place by the ball catch 62, an electrical connection is formed between the circuitry within the electrical guitar and the pickup 68. Thus, the pickup 68 detects the vibrations of the string and transmit an electrical signal derived from the vibrations back to the electric guitar which passes the electrical signal on to an amplifier (not shown). In addition, upon the insertion and removal of a universal pickup cradle 50, the strip connector 70 and the edge connector 82 effectively clean each other due to abrasion between the strip connector 70 and the edge connector 82. The edge connector 82 on the universal pickup cradle 50 has a plurality of individual connectors 84 which may be wired in any fashion depending upon the particular pickup. Each individual connector 84 is spring biased outwards so that it maintains electrical contact with the strip connector 70. In a preferred embodiment, there may be up to 10 of these individual edge connectors so that a plurality of different configurations may be set up based on the pickup. At a minimum, it is anticipated that there will be 7 edge connectors at the edge of each universal pickup cradle. The 7 edge connectors provide a separate electric signal to the guitar for each of the typical 6 electrical guitar strings. The seventh edge connector is used as a universal/common electrical ground pin. Thus, regardless of the type of pickup used, there are typically at least 7 edge connectors on each universal pickup cradle. In most conventional pickups, the pickup actually only provides a single sum signal which is a sum of the vibrations of all of the 6 strings of the guitar. However, with this embodiment of the invention, a separate electrical signal for each of the 6 strings of the guitar is possible and many advantages result.

Each pickup mounted on the universal pickup cradle 50 is preferably adjustable in terms of its own height relative to its pickup cradle by means of a plurality of adjustment bolts (not shown). Thus, the height of the pickup may be slightly changed in order to change the response of the pickup to the vibration of the strings.

In addition to the strip connector 70 and the edge connector 82 described above, the connection between the universal pickup cradle 80 and the receptacle cavities 36 through 40, may be any other type of electrical connector which will provide electrical connection between the universal pickup cradle and the receptacle cavity in a sliding relationship. Thus, the invention is not limited to a particular type of electrical connector on either the universal pickup carriage 50 or the receptacle cavities 36–40. As described above, the outside dimensions of the universal pickup cradles are identical for any type of pickup. However, the actual dimensions of the pickup 68 may vary depending on the type of pickup being used. Thus, any type of pickup may be mounted onto a universal pickup cradle and then inserted into one of the receptacle cavities in accordance with the invention. Now, a second embodiment of the receptacle cavities and the universal pickup cradle will be described.

FIG. 7 is a diagram illustrating an electrical guitar 20 that includes a neck receptacle cavity 90, a middle receptacle cavity 92, and a bridge receptacle cavity 94 having a slightly different configuration than the first embodiment in FIG. 1. In particular in this embodiment, an indexing portion 96 is a slanted portion of the cavity. These cavity receptacles have the same other elements as the receptacles described with respect to FIG. 1, such as the strip connector and a dimple, and these other elements of these receptacles will not be described here.

FIG. 8 is a perspective view of a universal pickup cradle 98 in accordance with the second embodiment, which may fit in only one direction into the receptacle cavities 90–94 as shown in FIG. 7. As shown, the universal pickup carriage 98 has a slanted portion 100 so that the shape of the universal pickup carriage 98 will only fit in one direction into the receptacles cavities 90–94. Once again, this is important so that an edge connector 102 of the universal pickup cradle will be properly connected to a strip connector (not shown)

in one of the cavities 90–94 once the universal pickup cradle 98 is seated within one of the receptacle cavities. As with the embodiment described above, this universal pickup cradle 98 has a plurality of ball catches 62 which interact with a dimple in the receptacle cavity in order to secure the universal pickup carriage 98 within the receptacle cavities. As above, this universal pickup cradle 98 has a body portion 104, a second portion 106 mounted on top of the body portion 104, and a pickup 108 which is mounted on top of the second portion. Thus, other than the different indexing portion, this embodiment operates in a similar manner to the embodiment described above. Thus, this universal pickup carriage 98 provides the user with the option of placing any pickup within any one of the cavities as shown in FIG. 7. Now, the ball catch 62 will be described in more detail.

FIG. 9 is a cross sectional side view of the universal pickup carriage 50, 98 and particular the ball catch 62. The ball catch 62 includes a ball 110 seated within a channel 112. The overall diameter of the ball is slightly larger than the channel width such that the ball is trapped in the channel. In order to bias the ball out of the channel, a spring 114 is located behind the ball. Thus, as the universal pickup carriage is inserted into one of the receptacle cavities, as it passes the dimple, the ball is pushed back into the channel and then springs back once the dimple has been passed. Thus, the ball catch 62 holds the universal pickup carriage 50, 98 within the receptacle cavities in the desired position during operation.

FIGS. 10–14 show an electric guitar 150 in which the receptacle cavities 36, 38 and 40 or 90, 92 and 94 in the FIGS. 1–9 embodiments have been replaced with a single cavity 152. The cavity 152 is dimensioned to receive a pair of pickup cradles 154 and 156 (See FIG. 13). As shown in FIGS. 12A–12B, a single pickup cradle 154 in the cavity 152 is movable from a first position in the cavity 152 to a second position in the cavity without requiring the pickup cradle to be removed from the cavity.

The guitar 150 has a pickup 158 of conventional design mounted in body 160 of the guitar adjacent to neck 162 and a piezoelectric pickup 163 of conventional design provided in bridge 165 of the guitar. If desired, the guitar 150 can be used with only this pickup and a speaker 164 mounted in the cavity 152, as shown in FIG. 14. Other modules could be used in the cavity 152, such as a laser light source (not shown), either alone or in combination with a cradle 154 or 156 containing a second pickup.

The guitar 150 has a conventional set of controls 166, including volume and bass/treble knobs 167, a five position switch 168 for selecting pickup combinations and a bypass switch 169. The function and operation of these controls 166 is well known to electric guitar players and will therefore not be described further. The guitar 150 also has three additional controls: an increment button 171, a decrement button 173 and a reset/reprogramming button 175. These controls are for choosing among a set of stored digital effects in an on-board, programmable effects module 177 in body 160 of the guitar. The programmable effects module 177 includes a programmable read only memory (PROM) integrated circuit 179 and a controller integrated circuit 181 incorporating a processor and random access memory (RAM) for read out of digital effects stored in the PROM 179 and for reprogramming the PROM with new effects patches. A conventional amplifier output receptacle 183 completes the front panel of the electric guitar 150. If desired, an inobtrusive display (not shown) can be provided adjacent to the buttons 171, 173 and 175 for indicating which stored digital effect has been selected with the buttons. The front panel of the guitar 150 is provided in a conventional pick guard 185. As shown, the guitar 150 can be played in a conventional manner by any musician familiar with a conventional electric guitar, such as a Fender Stratocaster, which the guitar 150 is built to resemble. In this mode of operation, the buttons 171, 173 and 175 are not used.

In operation using the buttons 171, 173 and 175, with the guitar in stand alone mode, stored effects in the PROM 179 are used by the processor 181 to modify a pickup signal from any combination of the pickups 154, 156, 158 and 160. The processor 181 includes an analog to digital (A/D) and digital to analog (D/A) converter for converting the pickup signal to digital form for modification by the processor and converting the modified pickup signal back to analog form for output from the amplifier output receptacle 183. The buttons 171, 173 and 175 could also be used with an external source of digital effects patches to download the patches to the RAM using buttons 171 and 173, audition them with the guitar 150, then accept them using the button 175 for replacing one of the stored effects in PROM 179 or adding to the stored effects in PROM 179 by reprogramming the PROM. An example of such an external source of digital effects patches could be a 1-900-Dial-A-PATCH service. Also shown in FIG. 11 is an access panel 187 allow access to the programmable effects module 177.

Further details of the cavity 152 and the cradles 154 and 156 are shown in FIGS. 15–19. The cavity 152 has a plurality of commercially available bullet connectors 170 mounted in a first wall 172 of the cavity and a plurality of edge connectors 174 mounted on a second wall 176 of the cavity 152. First and second strips 178 and 180, respectively attached to walls 172 and 176 of the cavity 152, have a detent 182 in the form of a groove or channel extending along the length of the strips 178 and 180.

Cradle 154 has a pair of ball catches 62 mounted near the top of each end 184 and 186. Upper portions 188 and 190 of the ends 184 and 186 are respectively shaped to mate with the first and second strips 178 and 180, which have different mating surfaces, so that the cradle 154 can only be inserted into the cavity 152 in one orientation. End 184 has a set 192 of strip connectors dimensioned and positioned to engage the bullet connectors 170 in the cavity 152. End 186 has a set 194 of strip connectors dimensioned and positioned to engage strip connectors 174 in the cavity 152.

In practice, the cradles 154 and 156 are implemented with a body made of a self lubricating plastic material that also approximates the acoustic quality of the solid wooden guitar body 160. A particularly preferred plastic material for both qualities is a natural acetal plastic, which is widely commercially available. Other suitable plastic materials include nylon and polytetrafluoroethylene.

FIG. 20 shows a replaceable electronics module 200, which fits into receptacle 202 in body 160 of the guitar 150 (see also FIG. 10). The electronics module 200 has a set 204 of strip connectors for connecting to circuit components within or on the guitar 150 through a suitable wiring harness (not shown) inside the body 160 of the guitar. Input/output ports 206 and 208 are mounted at surface 210 of the module 200. The surface 210 is curved to conform to the shape of the guitar body 150 at the receptacle 202. The replaceable electronics module 200 can be used either in addition to the programmable effects module 177 or as a replacement for it.

FIGS. 21–23 show a guitar system 250 which utilizes the high degree of flexibility provided with the invention. In addition to the receptacle 202 for receiving different electronic modules 200, the cavity 152 in the body 160 of the guitar can be utilized to provide additional input/output (I/O)

connections. In addition to the pickups 152 and 154, or in combination with a modified form of the pickups 154 and 156, various I/O modules 256 can be inserted in the module receptacle to give I/O connections 258 meeting a variety of electronic music standards, such as GK2A, MIDI I/O, and the like. In FIG. 22, interconnections internal to the guitar system 250 are shown. In this figure, it is assumed that all of the control functions for the guitar are contained in the replaceable electronics module 200, but similar interconnections would be made if an onboard module 177 (FIGS. 10–11) were present. This means that the module 200 includes at least a PROM integrated circuit 179 and a controller integrated circuit 181, as described for the onboard module 177 in FIG. 10. The fixed pickups 158 and 163 are connected to the electronics module 200 by lines 262 and 264, respectively. The connectors 170 in receptacle 152 are connected to the electronics module 200 by lines 264 and 266. The connectors 174 are connected to the electronics module 200 by lines 268 and 270. The switches and controls comprising the front panel 272 of the guitar 150 are connected to the module 200 by line 274.

FIG. 23 is a somewhat more detailed system block diagram for the guitar system 250. As shown, various interchangeable function modules 276, such as the pickup cradles 154 and 156, speaker module 164 and/or various other effects modules, inserted in the receptacle 152 are connected by lines 280 and 282 to provide analog signals to replaceable electronics module 200. The interchangeable function modules 276 are also connected via a digital I/O bus 284 to exchange digital signals with the electronics module 200. Lines 286 and 288 provide power and ground connections to the interchangeable function modules. Similarly, the fixed guitar pickup 158 and the piezoelectric pickup 163 are connected by lines 290 and 292, respectively, via line 280 to provide analog inputs to the electronics module 200. The front panel 272 is connected via switch and potentiometer connections 294 and via the digital I/O bus 284 to the electronics module 200.

It should now be readily apparent to those skilled in the art that a novel interchangeable pickup, system and method capable of achieving the described advantages and features of the invention has been provided. It further should be apparent that various changes in the invention as shown and described may be made. It is intended that such changes be included within the spirit and scope of the claims appended hereto.

What is claimed is:

1. An interchangeable pickup module for an electric stringed instrument, which comprises:
 (a) a body of dielectric material having a top surface, a bottom surface and a plurality of side surfaces defining a substantially rectangular solid;
 (b) a pickup for the electric stringed instrument attached to said body of dielectric material and extending upward from the top surface of said body of dielectric material;
 (c) a plurality of electrical connector elements attached to at least one of the side surfaces of said body of dielectric material, said electrical connector elements being electrically coupled to said pickup; and
 (d) at least one catch element mounted on each of an opposing pair of the side surfaces.

2. The interchangeable pickup module of claim 1 in which the dielectric material of said body comprises a self lubricating plastic.

3. The interchangeable pickup module of claim 2 in which the self lubricating plastic is a natural acetal.

4. The interchangeable pickup module of claim 1 in which said catch element comprises a spring loaded ball member.

5. The interchangeable pickup module of claim 1 additionally comprising a layer of pick guard material attached to the top surface of said body.

6. The interchangeable pickup module of claim 1 in which said electrical connector elements comprise conductor strips.

7. An electric stringed instrument, which comprises:
 (a) a first body having a top surface, and a bottom surface and at least one side surface;
 (b) a plurality of strings mounted over the top surface;
 (c) at least one generally rectangular shaped receptacle for a pickup, said receptacle extending completely through said first body from the top surface to the bottom surface and having four side surfaces defined by said first body, said receptacle having:
  (i) a plurality of first electrical connector elements attached to at least one of the side surfaces of said receptacle;
  (ii) at least one catch element mounted on each of an opposing pair of the side surfaces;
 (d) at least one interchangeable pickup module mounted in said at least one generally rectangular shaped receptacle, which at least one interchangeable pickup module comprising:
  (i) a second body of dielectric material having a top surface, a bottom surface and a plurality of side surfaces defining a substantially rectangular solid;
  (ii) a pickup for the electric stringed instrument attached to said second body of dielectric material and extending upward from the top surface of said second body of dielectric material;
  (iii) a plurality of second electrical connector elements attached to at least one of the side surfaces of said second body of dielectric material, said second electrical connector elements being electrically coupled to said pickup; and
  (iv) at least one catch element mounted on each of an opposing pair of the side surfaces.

8. The electric stringed instrument of claim 7 in which the dielectric material of said second body comprises a self lubricating plastic.

9. The electric stringed instrument of claim 8 in which the self lubricating plastic is a natural acetal.

10. The electric stringed instrument of claim 7 in which said first connector elements comprise spring loaded ball members.

11. The electric stringed instrument of claim 7 additionally comprising a layer of pick guard material attached to the top surface of said body, said receptacle extending through said pick guard material.

12. The electric stringed instrument of claim 7 in which said catch element comprises a detent.

13. The electric stringed instrument of claim 12 in which the detent comprises a channel extending parallel to the top surface of said body along the opposing side surfaces.

* * * * *